United States Patent
Kim et al.

(10) Patent No.: US 7,439,177 B2
(45) Date of Patent: Oct. 21, 2008

(54) METHOD OF MANUFACTURING SEMICONDUCTOR DEVICE FOR IMPROVING CONTACT HOLE FILLING CHARACTERISTICS WHILE REDUCING PARASITIC CAPACITANCE OF INTER-METAL DIELECTRIC

(75) Inventors: Chan Bae Kim, Seoul (KR); Chai O Chung, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 266 days.

(21) Appl. No.: 11/498,517

(22) Filed: Aug. 3, 2006

(65) Prior Publication Data
US 2007/0037398 A1    Feb. 15, 2007

(30) Foreign Application Priority Data
Nov. 8, 2005    (KR) ............... 10-2005-0106426

(51) Int. Cl.
*H01L 21/44* (2006.01)
(52) U.S. Cl. ............ 438/669; 438/672; 438/675; 438/706; 257/E21.27; 257/E21.578
(58) Field of Classification Search ............ 257/E21.27, 257/E21.578
See application file for complete search history.

(56) References Cited

U.S. PATENT DOCUMENTS
6,939,808 B2 * 9/2005 Tzou et al. ............... 438/706
2002/0014643 A1 * 2/2002 Kubo et al. ............... 257/290

FOREIGN PATENT DOCUMENTS
KR    10-1999-0088401    12/1999
KR    1020020028492    4/2002

OTHER PUBLICATIONS
Notice of Preliminary Rejection, Korean Patent Appln. No. 10-2005-0106426. Mar. 21, 2007.

* cited by examiner

*Primary Examiner*—Scott B. Geyer
*Assistant Examiner*—Mohsen Ahmadi
(74) *Attorney, Agent, or Firm*—Ladas & Parry LLP

(57) ABSTRACT

In manufacturing a semiconductor device, a metal film is formed on a semiconductor substrate, and a high-temperature amorphous carbon film pattern for defining a wiring forming area is formed on the metal film. The metal film is etched by using the high-temperature amorphous carbon film pattern as an etching barrier to form a metal wiring. A low-temperature amorphous carbon film as an IMD is formed on the resultant structure so as to cover the metal wiring including the high-temperature amorphous carbon film pattern. The low-temperature amorphous carbon film and the high-temperature amorphous carbon film pattern are etched to form a contact hole, which has greater width in an upper portion than in a lower portion thereof. Finally, a plug metal film is formed on the low-temperature amorphous carbon film to fill the contact hole.

15 Claims, 5 Drawing Sheets

METHOD OF MANUFACTURING SEMICONDUCTOR DEVICE FOR IMPROVING CONTACT HOLE FILLING CHARACTERISTICS WHILE REDUCING PARASITIC CAPACITANCE OF INTER-METAL DIELECTRIC

BACKGROUND OF THE INVENTION

1. Field of the Invention

The present invention relates generally to a method for manufacturing a semiconductor device, and more particularly to a method for manufacturing a semiconductor device, which can improve the filling characteristic of a contact hole during the formation of metal wiring contact plug and can improve the operation characteristics of the device by reducing the parasitic capacitance of an inter-metal dielectric.

2. Description of the Prior Art

For higher integration of semiconductor devices, width of the metal wirings and breadth of the contact holes providing a path for electrical connection between the lower and upper metal wirings tend to decrease. However, the process of patterning a narrow-width wiring metal film as well as the process of fully filling a narrow or fine-sized contact hole become more and more difficult.

Further, the spacing between the metal wirings is shortened due to the high integration of the device, and this introduces more and more of parasitic capacitance caused by an Inter-Metal Dielectric (hereinafter referred to as "IMD"). Such parasitic capacitance is a main factor impeding the high-speed operation of the device.

Therefore, research has been directed to solving the above-mentioned problems related to the high integration of semiconductor devices and, as a part of such research, a proposal has been made to utilize amorphous carbon as a hard mask film for forming a metal wiring or to use the amorphous carbon as an IMD.

Amorphous carbon is easily removable like a photoresist film, but it can still be used as a hard mask because of its higher hardness than the photoresist film. The amorphous carbon also has a high etching selectivity ratio when compared to the other conventional hard mask materials. Thus, when the amorphous carbon is used as a hard mask material for metal film etching, a photoresist film pattern can be formed more thinly, and thus it is possible to prevent the collapse phenomenon or the Critical Dimension (CD) trimming from being caused by the increase in thickness of the photoresist film pattern, so as to obtain a metal wiring having a fine pattern.

Also, since amorphous carbon is a low-k material capable of reducing the parasitic capacitance, it can suppress a RC delay phenomenon, which can then elevate the operating speed of the semiconductor device when the amorphous carbon is applied as an IMD.

Hereinafter, a detailed description will be given of a semiconductor device manufacturing method including a process of forming a conventional metal wiring, in which amorphous carbon is applied as a hard mask and an IMD, with reference to FIGS. 1A to 1D.

Referring to FIG. 1A, a wiring metal film 110 is formed on a semiconductor substrate 100, and an amorphous carbon film 120 is formed on the wiring metal film 110. Next, an oxide film 130 is formed on the amorphous carbon film 120, and then a photoresist film 140 (which is for defining a wiring forming area) is formed on the oxide film 130. Here, the oxide film 130 functions as an antireflection film when the photoresist film 140 is etched, and is used as a hard mask for etching the amorphous carbon film 120.

Referring to FIG. 1B, the photoresist film 140 of FIG. 1A is etched through a lithography process including well-known exposure and etching processes to form a photoresist film pattern 140a defining the wiring forming area. Subsequently, a portion of the oxide film 130 under the photoresist film pattern 140a is etched by using the photoresist film pattern 140a as an etching barrier. During this process, the photoresist film pattern 140a suffers a partial loss in thickness. In succession, an exposed portion of the amorphous carbon film 120 is etched by using the residual photoresist film pattern 140a and the etched oxide film 130 as an etching barrier. During this process, the residual photoresist film pattern 140a may be lost completely.

Referring to FIG. 1C, in a state where the residual photoresist film pattern 140a and the etched oxide film 130 have been removed, the metal film 110 is etched by using the etched amorphous carbon film 120 as an etching barrier to form a metal wiring 110a.

As stated above, when the amorphous carbon film 120 is used as a hard mask film for etching a wiring metal film 110, it is possible to prevent the collapse phenomenon which may occur when the photoresist film pattern is used or the CD trimming. This then makes possible to realize a metal wiring having a fine pattern even when a convention ArF exposure system is used—that is, it would also be possible to realize a metal wiring having a fine pattern even when an exposure system having a higher resolution than that of the ArF exposure system is not used.

Referring to FIG. 1D, in a state where the etched amorphous carbon film 120 has been removed, a low-k IMD 150 such as an amorphous carbon film is formed on the resultant structure such that the low-k IMD 150 covers the metal wiring 110a.

Thereafter, although not shown in the drawings, the IMD 150 is etched to form a contact hole through which the metal wiring 110a is exposed. The contact hole is then filled with an electrically conductive contact plug film, and then well-known subsequent processes are successively performed to finally manufacture a semiconductor device.

However, in the prior art as described above, in which the low-k amorphous carbon film 150 is used as the IMD, the etching uniformity is not good during the etching process for forming the contact hole, and as a result a bowing phenomenon, in which the upper portion of the formed contact hole has a pot-like shape, occurs. This causes a problem in that a filling characteristic deteriorates when the contact hole is subsequently filled with the electrically conductive film, and it is difficult to ensure the reliability of a metal wiring including the contact plug. Because of this problem occurring when the contact hole is filled with the electrically conductive film, there is still a difficulty in applying the low-k material such as the amorphous carbon film capable of lowering parasitic capacitance to the IMD.

SUMMARY OF THE INVENTION

Accordingly, the present invention has been made to solve the above-mentioned problem occurring in the prior art, and an object of the present invention is to provide a method for manufacturing a semiconductor device, which can improve the reliability of a metal wiring and the operation characteristics of the device by improving a filling characteristic of a contact hole for the metal wiring when low-k amorphous carbon capable of lowering parasitic capacitance is applied as an IMD.

In order to accomplish this object, there is provided a method for manufacturing a semiconductor device, the method comprising the steps of: forming a metal film on a semiconductor substrate; forming a high-temperature amorphous carbon film pattern for defining a wiring forming area on the metal film; etching the metal film by using the high-temperature amorphous carbon film pattern as an etching barrier to form a metal wiring; forming a low-temperature amorphous carbon film as an IMD on an entire surface of a resultant structure such that the low-temperature amorphous carbon film covers the metal wiring including the high-temperature amorphous carbon film pattern; etching the low-temperature amorphous carbon film and the high-temperature amorphous carbon film pattern to form a contact hole, which has greater width in an upper portion than in a lower portion thereof, and through which the metal wiring is exposed; and forming a plug metal film on the low-temperature amorphous carbon film such that the contact hole is filled with the plug metal film.

Here, the step of forming the high-temperature amorphous carbon film pattern comprises the steps of: sequentially forming a high-temperature amorphous carbon film, a first hard mask film and a first photoresist film pattern for defining the wiring forming area on the metal film; etching the first hard mask film and the high-temperature amorphous carbon film by using the first photoresist film pattern as an etching barrier; and removing the first photoresist film pattern and the first hard mask film.

The high-temperature amorphous carbon film is formed in a thickness of 1500 to 2000 Å.

The high-temperature amorphous carbon film is formed using a source power of 300 to 1000 W according to a PE-CVD process.

The high-temperature amorphous carbon film contains 9 to 19% H and 81 to 91% C.

The first hard mask film is an oxide film, and is formed in a thickness of 600 to 1000 Å.

The step of removing the first photoresist film pattern and the first hard mask film is performed by means of a HF-based cleaning solution for 10 second to 1 minute.

The low-temperature amorphous carbon film is formed in a thickness of 5000 to 7000 Å.

The low-temperature amorphous carbon film is formed using a source power of 200 to 800 W according to a PE-CVD process.

The low-temperature amorphous carbon film contains 32 to 42% H and 58 to 68% C.

The step of etching the low-temperature amorphous carbon film and high-temperature amorphous carbon film to form the contact hole comprises the steps of: sequentially forming a second hard mask film and a second photoresist film pattern, through which a contact hole forming area is exposed, on the low-temperature amorphous carbon film; etching the second hard mask film, the low-temperature amorphous carbon film and the high-temperature amorphous carbon film pattern by using the second photoresist film pattern as an etching barrier; and removing the second photoresist film pattern and the second hard mask film.

The second hard mask film is an oxide film, and is formed in a thickness of 1000 to 2000 Å.

The step of removing the second photoresist film pattern and the second hard mask film is performed by means of a HF-based cleaning solution for 10 seconds to 1 minute.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
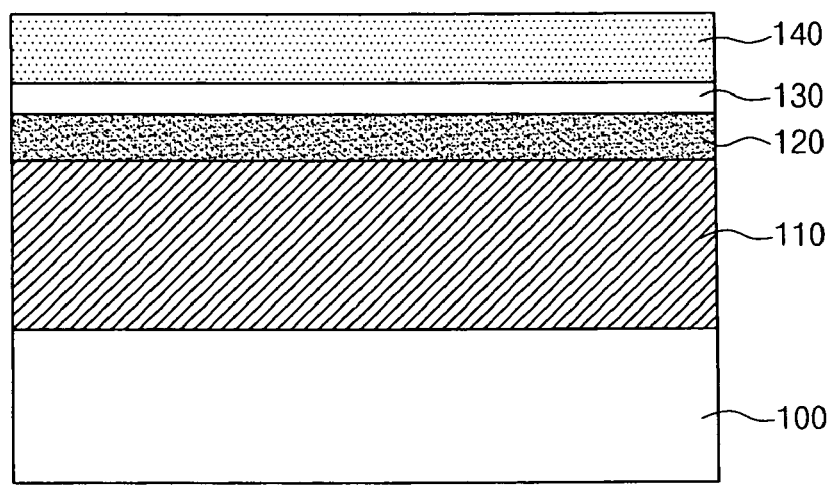
FIGS. 1A to 1D are cross-sectional views for showing the steps of manufacturing a semiconductor device according to prior art.
Figure 1B:
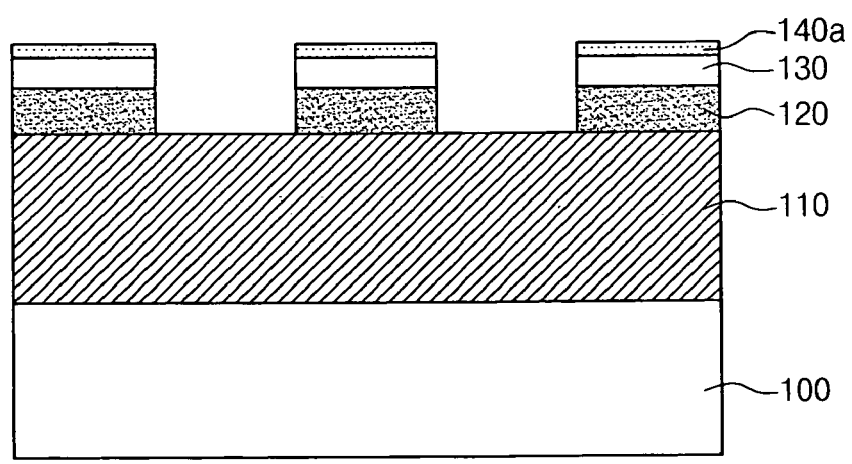
Figure 1C:
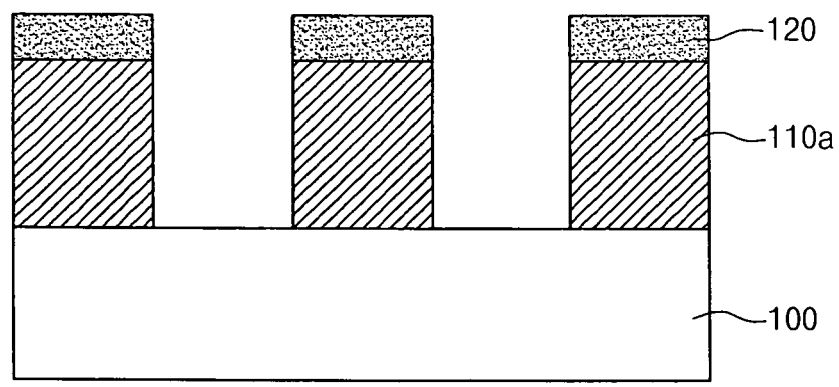
Figure 1D:
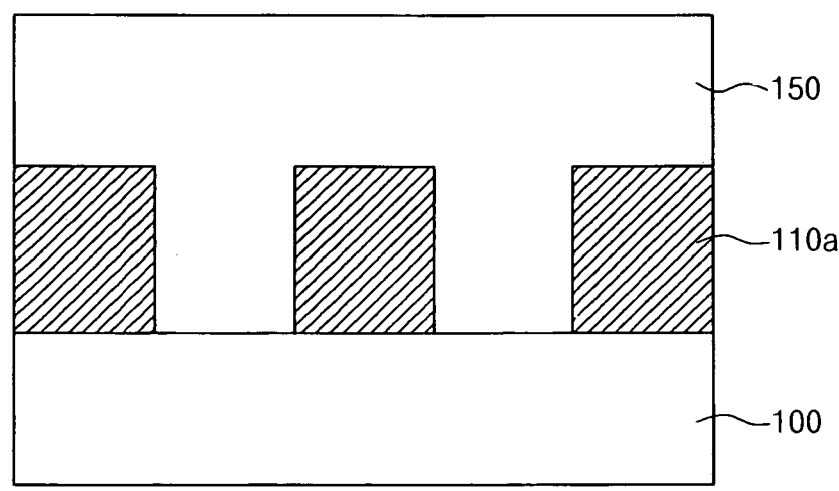

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 2A to 2F are cross-sectional views for showing the steps of a method for manufacturing a semiconductor device according to a preferred embodiment of the present invention.

Figure 2A:
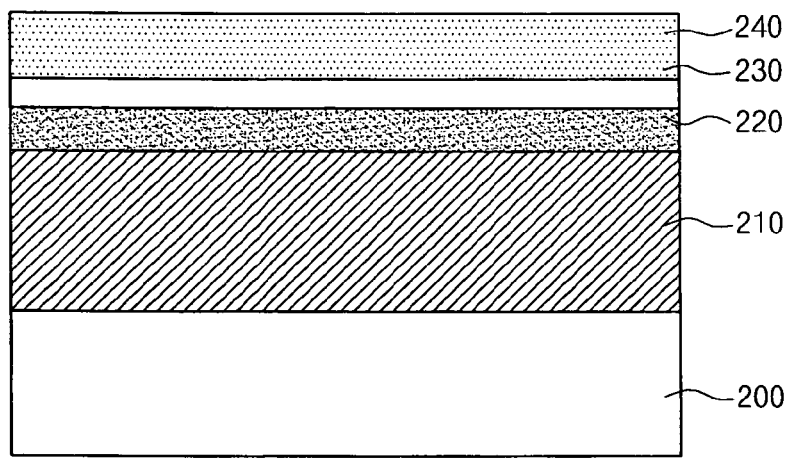
FIGS. 2A to 2F are cross-sectional views for showing the steps of manufacturing a semiconductor device in accordance with a preferred embodiment of the present invention.

Referring to FIG. 2A, a lower wiring metal film 210 is formed on a semiconductor substrate 200, and a high-temperature amorphous carbon film 220, a first oxide film 230, and a first photoresist film 240 are formed in sequence on the metal film 210.

Here, the high-temperature amorphous carbon film 220 is formed using a source power of 300 to 1000 W according to a PE-CVD (Plasma Enhanced Chemical Vapor Deposition) process at a high temperature in a range of 500-600 degrees Celsius such that it has a thickness of 1500 to 2000 Å, and contains constituent elements of 9 to 19% of H and 81 to 91% of C. The first oxide film 230 is formed to a thickness of 600-1000 Å and is used as an antireflection film and a hard mask film.

Figure 2B:
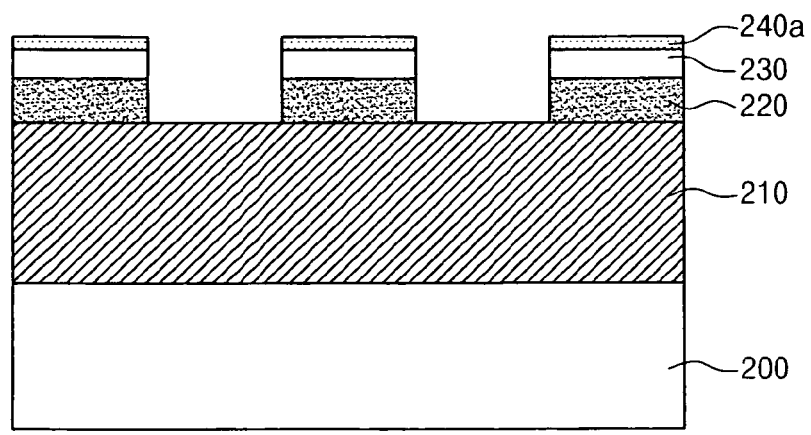

Referring to FIG. 2B, the first photoresist film 240 (of FIG. 2A) is etched through a well-known lithography process to form a first photoresist film pattern 240a for defining the wiring forming area. Next, the first oxide film 230 and the high-temperature amorphous carbon film 220 are etched in sequence by using the first photoresist film pattern 240a as an etching barrier. During or thereafter the process above, the first photoresist film pattern 240a may be removed completely or may remain with the thickness having been partially reduced.

Figure 2C:
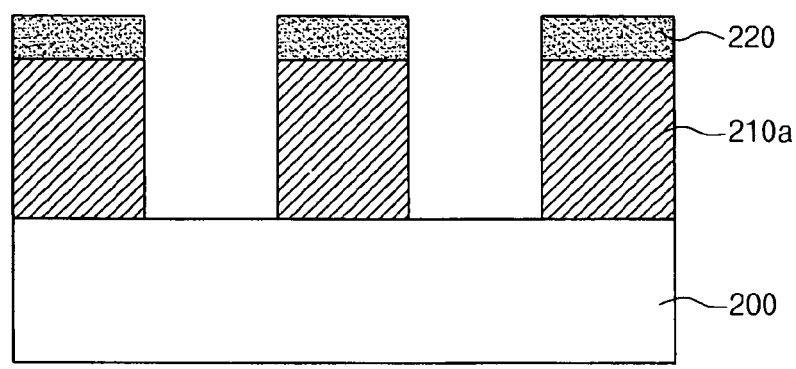

Referring to FIG. 2C, in a state where the residual first photoresist film pattern 240a and the etched first oxide film 230 are removed through a wet cleaning process using a HF (Hydro Fluorine)-based cleaning solution and having a duration of 10 seconds to 1 minute, the metal film 210 is etched by using the etched high-temperature amorphous carbon film 220 as an etching barrier to form a metal wiring 210a. Here, the high-temperature amorphous carbon film 220 suffers almost no loss from the HF-based cleaning solution during the wet cleaning process.

Figure 2D:
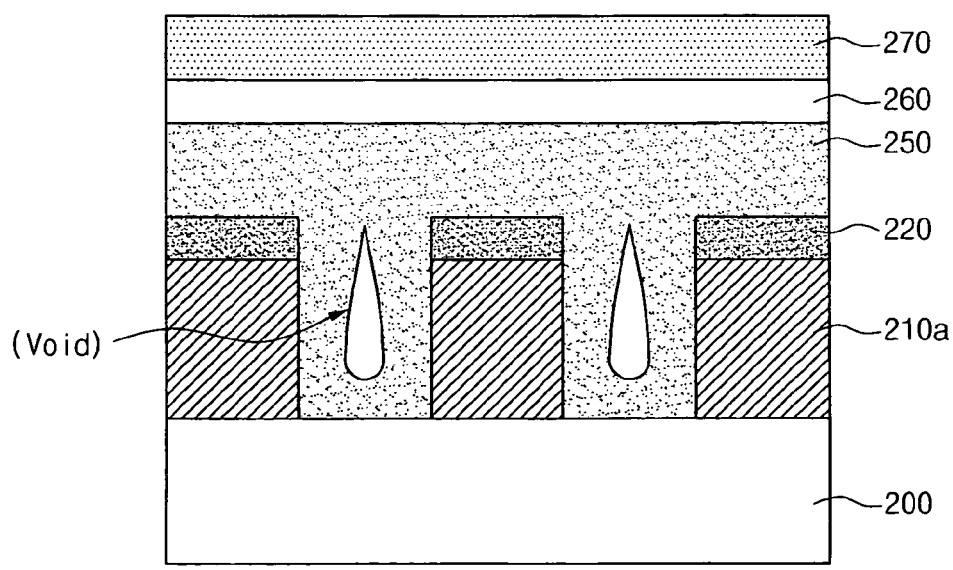

Referring to FIG. 2D, a low-temperature amorphous carbon film 250 as an IMD is formed on the entire surface of the resultant structure according to a low-temperature process such that the low-temperature amorphous carbon film 250 covers the exposed surface of the substrate 200 between two metal wirings 210a and the etched high-temperature amorphous carbon film 220. Next, a second oxide film 260 and a second photoresist film 270 are formed on the low-temperature amorphous carbon film 250 as shown in FIG. 2D.

The low-temperature amorphous carbon film 250 of FIG. 2D is formed using a source power of 200 to 800 W according to a PE-CVD process at a low temperature in the range of 250-400 degrees Celsius such that it has a thickness of 5000 to 7000 Å, and contains constituent elements of 32 to 42% of H and 58 to 68% of C.

Figure 2E:
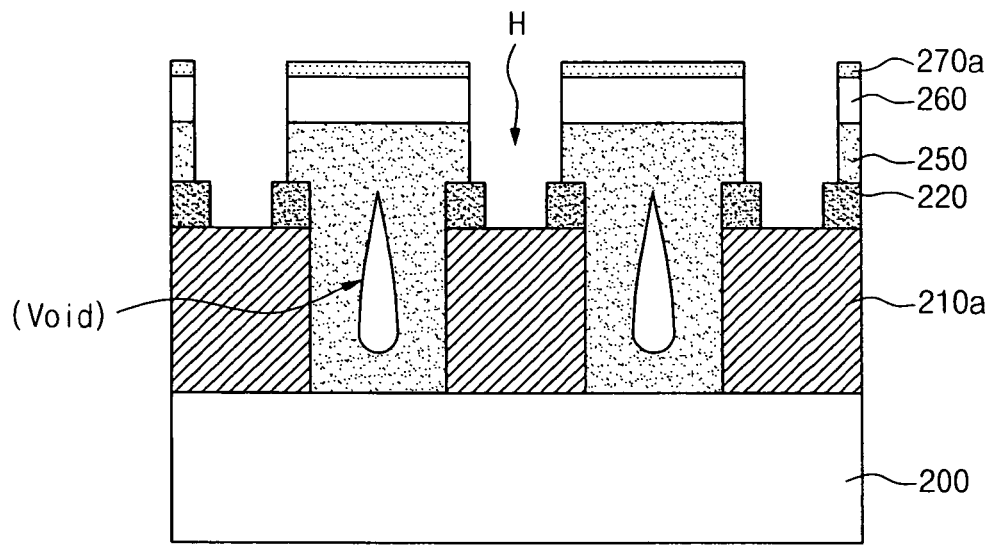
Figure 2F:
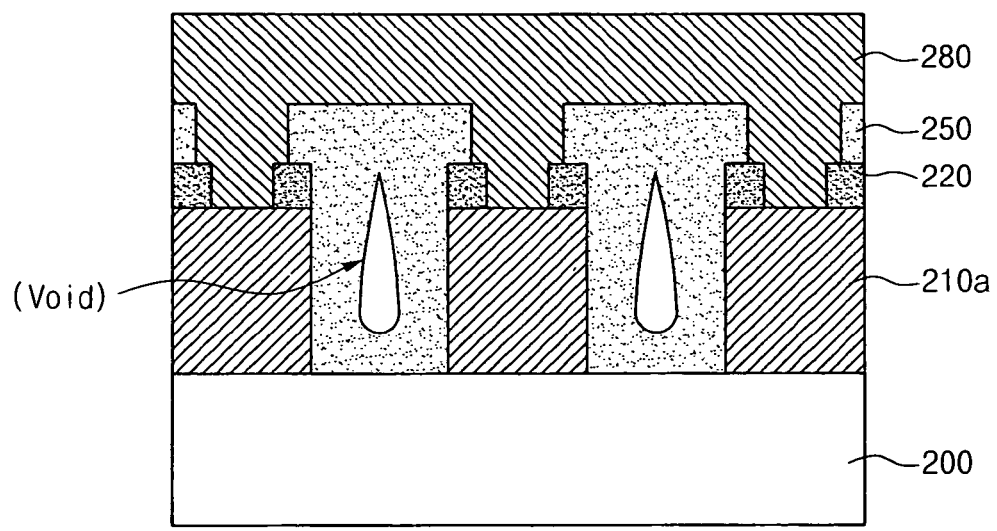

When compared to the high-temperature amorphous carbon film 220, the low-temperature amorphous carbon film 250 has a lower dielectric constant, and provides high etching speed due to its low density. Also, since the low-temperature amorphous carbon film 250 has poor step coverage, voids as shown in FIGS. 2D-2F are formed when the low-temperature amorphous carbon film 250 is deposited on the substrate formed with the metal wiring 210a. Moreover, in the embodiment of the present invention, the voids have relatively large size because the low-temperature amorphous carbon film 250 shows high depositing speed on the surface of the high-temperature amorphous carbon film 220, in which C—H dangling bonds exist.

In general, voids that are present inside an interlayer insulating film during the gate and bit line forming steps negatively effect the operations of the semiconductor memory device, such as electrical short circuits and cleaning solution infiltration. However, the voids formed inside the IMD gives rise to almost no short circuit, and rather gives an positive effect by lowering the dielectric constant of the IMD.

Similarly to the first oxide film 230, the second oxide film 260 is used as an antireflection film and a hard mask film, and is formed to a thickness of 1000 to 2000 Å.

Referring to FIG. 2E, the second photoresist film 270 is etched through the well-known exposure and etching processes to form a second photoresist film pattern 270a through which a contact hole forming area is exposed. Next, using the second photoresist film pattern 270a as an etching barrier, an exposed portion of the second oxide film 260 is etched, and the low-temperature amorphous carbon film 250 and the high-temperature amorphous carbon film 220 thereunder are further etched to form a contact hole H, whose width in the upper portion of the contact hole H greater than the width in the lower portion of the contact hole H, through which the metal wiring 210a is exposed as a result.

At this time, the reason why the upper portion of the contact hole H has greater width than that the width of the lower portion is that the high-temperature amorphous carbon film 220 formed at a lower end of the contact hole H has lower etching speed than that of the low-temperature amorphous carbon film 250 formed at upper end of the contact hole H. Since the upper portion of the contact hole H has greater width than that of the lower portion of the contact hole H, a subsequent process of filling the contact hole H becomes easier.

Referring to FIG. 2F, in a state where the residual second photoresist film pattern 270a and the etched second oxide film 260 are removed through a wet cleaning process using a HF (Hydro Fluorine)-based cleaning solution and having a duration of 10 seconds to 1 minute, a plug metal film 280 is deposited on the low-temperature amorphous carbon film 250 such that the contact hole H is filled with the plug metal film 280.

Thereafter, although not illustrated in the drawings, subsequent well-known processes are performed to finally manufacture a semiconductor device according to an embodiment of the present invention.

In this way, by using the low-temperature amorphous carbon film (such as 250) having the lower density and etching speed than those of the high-temperature amorphous carbon film as the IMD, in a state where the high-temperature amorphous carbon film (such as 220) used as the hard mask film for metal wiring formation is not yet removed, the present invention can provide the contact hole (such as H) having an wider width in its upper portion than in its lower portion. Thus, the present invention can effectively improve the deterioration of the filling characteristic of the contact hole, which has been problematic when a low-k material such as amorphous carbon is applied as the IMD. Consequently, the present invention improves the operating speed of the device by reducing inter-metal wiring parasitic capacitance and enhances the reliability of the metal wiring including the contact plug.

As described above, by using the high temperature amorphous carbon (such as 220) as a hard mask film for metal wiring formation and then reusing it as a first IMD, and using the low-temperature amorphous carbon film (such as 250), which has lower density and etching speed than those of the high-temperature amorphous carbon, as a second IMD, the present invention can provide a contact hole (such as H) having greater width in its upper portion than in its lower portion. Thus, the present invention can effectively improve the deterioration of a filling characteristic of the contact hole (such as H), which has been problematic when low-k material such as amorphous carbon is applied as the IMD. Consequently, since the low-k amorphous carbon can be easily applied as the IMD owing to improvement in the contact hole filling, the present invention can improve the operating speed of a device by reducing inter-metal wiring parasitic capacitance, and enhance the reliability of the metal wiring including the contact plug.

Although a preferred embodiment of the present invention have been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device comprising the steps of:

forming a metal film on a semiconductor substrate;

forming a high-temperature amorphous carbon film pattern on the metal film for defining a wiring forming area;

etching the metal film by using the high-temperature amorphous carbon film pattern as an etching barrier to form a metal wiring;

forming a low-temperature amorphous carbon film as an IMD on an entire surface of a resultant structure such that the low-temperature amorphous carbon film is filled to cover the etched portion of the metal wiring and the high-temperature amorphous carbon film pattern formed on the metal wiring;

etching the low-temperature amorphous carbon film and the high-temperature amorphous carbon film pattern to form a contact hole on the metal wiring, which has greater width in an upper portion bounded by the low-temperature amorphous carbon film than in a lower portion thereof bounded by the high-temperature amorphous carbon film, and through which contact hole the metal wiring is exposed; and forming a plug metal film such that the contact hole is filled with the plug metal film.

2. The method of claim 1, wherein the step of forming the high-temperature amorphous carbon film pattern comprises the steps of:

sequentially forming a high-temperature amorphous carbon film, a first hard mask film and a first photoresist film pattern for defining the wiring forming area on the metal film;

etching the first hard mask film and the high-temperature amorphous carbon film by using the first photoresist film pattern as an etching barrier; and removing the first photoresist film pattern and the first hard mask film.

3. The method of claim 2, wherein the high-temperature amorphous carbon film is formed to a thickness of 1500 to 2000 Å.

4. The method of claim 2, wherein the high-temperature amorphous carbon film is formed using a source power of 300 to 1000 W according to a PE-CVD process.

5. The method of claim 2, wherein the high-temperature amorphous carbon film contains 9 to 19% of H and 81 to 91% of C.

6. The method of claim 2, wherein the first hard mask film is an oxide film and is formed to a thickness of 600 to 1000 Å.

7. The method of claim 2, wherein the step of removing the first photoresist film pattern and the first hard mask film is performed by means of a HF-based cleaning solution for 10 seconds to 1 minute.

8. The method of claim 2, wherein the high-temperature amorphous carbon film pattern is formed by depositing an amorphous carbon film at a temperature in the range of 500-600 degree Celsius.

9. The method of claim 1, wherein the low-temperature amorphous carbon film is formed to a thickness of 5000 to 7000 Å.

10. The method of claim 1, wherein the low-temperature amorphous carbon film is formed using a source power of 200 to 800 W according to a PE-CVD process.

11. The method of claim 1, wherein the low-temperature amorphous carbon film contains 32 to 42% H and 58 to 68% C.

12. The method of claim 1, wherein the step of etching the low-temperature amorphous carbon film and the high-temperature amorphous carbon film to form the contact hole comprises the steps of:
  sequentially forming a second hard mask film and a second photoresist film pattern on the low-temperature amorphous carbon film, through which a contact hole forming area is exposed;
  etching the second hard mask film, the low-temperature amorphous carbon film, and the high-temperature amorphous carbon film pattern by using the second photoresist film pattern as an etching barrier; and
  removing the second photoresist film pattern and the second hard mask film.

13. The method of claim 12, wherein the second hard mask film is an oxide film, and is formed to a thickness of 1000 to 2000 Å.

14. The method of claim 12, wherein the step of removing the second photoresist film pattern and the second hard mask film is performed by means of a HF-based cleaning solution for 10 seconds to 1 minute.

15. The method of claim 1, wherein the low temperature amorphous carbon film pattern is formed by depositing an amorphous carbon film at a temperature in the range of 250-400 degree Celsius.

* * * * *